US010797696B2

(12) United States Patent
Lotz

(10) Patent No.: US 10,797,696 B2
(45) Date of Patent: Oct. 6, 2020

(54) FACTOR 1 INDUCTIVE SENSOR DEVICE

(71) Applicant: SENSTRONIC (SOCIETE PAR ACTIONS SIMPLIFIEE), Saverne (FR)

(72) Inventor: Thomas Lotz, Wasselonne (FR)

(73) Assignee: SENSTRONIC (SOCIETE PAR ACTIONS SIMPLIFIEE), Saverne (FR)

(*) Notice: Subject to any disclaimer, the term of this patent is extended or adjusted under 35 U.S.C. 154(b) by 36 days.

(21) Appl. No.: 16/085,887

(22) PCT Filed: Mar. 15, 2017

(86) PCT No.: PCT/FR2017/050587
§ 371 (c)(1),
(2) Date: Sep. 17, 2018

(87) PCT Pub. No.: WO2017/158287
PCT Pub. Date: Sep. 21, 2017

(65) Prior Publication Data
US 2019/0115918 A1    Apr. 18, 2019

(30) Foreign Application Priority Data

Mar. 16, 2016 (FR) .................... 16 52242

(51) Int. Cl.
H03K 17/95 (2006.01)
G01V 3/10 (2006.01)
G01D 5/20 (2006.01)

(52) U.S. Cl.
CPC ....... H03K 17/9525 (2013.01); G01D 5/2046 (2013.01); G01V 3/101 (2013.01);
(Continued)

(58) Field of Classification Search
CPC ......... G01V 3/10–108; H03K 17/9525; H03K 17/9502; H03K 17/9537; G01D 5/2046
(Continued)

(56) References Cited

U.S. PATENT DOCUMENTS 4,678,992 A * 7/1987 Hametta .................. G01F 1/115
324/173
4,956,606 A * 9/1990 Kwiatkowski ........... G01B 7/02
324/207.12
(Continued)

FOREIGN PATENT DOCUMENTS

EP    1 530 064 A1    5/2005
EP    1 580 536 A1    9/2005
(Continued)

OTHER PUBLICATIONS

International Search Report, dated Jun. 26, 2017, from corresponding PCT application No. PCT/FR2017/050587.

Primary Examiner — Patrick Assouad
Assistant Examiner — Demetrius R Pretlow
(74) Attorney, Agent, or Firm — Ipsilon USA, LLP

(57) ABSTRACT

Disclosed is a "factor 1" and inductive sensor device including an LC resonant circuit powered by a suitable generator, an operational chain of units for acquisition by sampling and processing of the response signal, and a functional set of units for evaluating at least one temporarily set value of the processed signal and supplying detection or non-detection information. The acquisition and processing unit includes analog a unit for filtering and/or amplifying the sampled response signal, and a unit for compensating the temperature drift of the response signal by correcting the sampled signal following the digital conversion thereof, associated with or including a temperature sensor.

20 Claims, 14 Drawing Sheets

(52) U.S. Cl.
CPC ..... *H03K 17/9502* (2013.01); *H03K 17/9537* (2013.01); *H03K 2017/9527* (2013.01)

(58) Field of Classification Search
USPC .................................................. 324/207.12
See application file for complete search history.

(56) References Cited

U.S. PATENT DOCUMENTS

| | | | |
|---|---|---|---|
| 5,158,166 A * | 10/1992 | Barson | G07D 5/08 |
| | | | 194/317 |
| 5,189,366 A * | 2/1993 | Mayo | G01N 27/023 |
| | | | 324/233 |
| 6,297,626 B1 * | 10/2001 | Boston | G01N 15/0656 |
| | | | 324/204 |
| 6,371,417 B1 * | 4/2002 | Southon | B61L 1/165 |
| | | | 246/247 |
| 7,106,052 B2 | 9/2006 | Ehls et al. | |
| 7,404,333 B2 | 7/2008 | Kesseler et al. | |
| 7,586,303 B2 | 9/2009 | Kirchdoerffer et al. | |
| 7,902,818 B2 | 3/2011 | Bernard et al. | |
| 7,994,778 B2 | 8/2011 | Kirchdoerffer et al. | |
| 8,734,184 B2 | 5/2014 | Franc et al. | |
| 9,007,071 B2 | 4/2015 | Gong et al. | |
| 9,619,677 B2 | 4/2017 | Franc et al. | |
| 9,995,778 B1 * | 6/2018 | Fiori, Jr. | G01R 27/2605 |
| 2001/0038291 A1 * | 11/2001 | Charneau | H03K 17/9545 |
| | | | 324/662 |
| 2003/0030566 A1 * | 2/2003 | Schmidt | H03K 17/954 |
| | | | 340/686.6 |
| 2003/0184301 A1 | 10/2003 | Bosnar | |
| 2004/0119470 A1 * | 6/2004 | Yajima | G01V 3/105 |
| | | | 324/253 |
| 2005/0094346 A1 | 5/2005 | Kirchdoerffer | |
| 2005/0162158 A1 | 7/2005 | Del Monte | |
| 2006/0164075 A1 * | 7/2006 | Niwa | G01D 3/0365 |
| | | | 324/207.16 |
| 2007/0001667 A1 * | 1/2007 | Kirchdoerffer | H03K 17/9505 |
| | | | 324/207.15 |
| 2008/0054893 A1 * | 3/2008 | Humphreys | G01V 3/107 |
| | | | 324/239 |
| 2008/0054905 A1 * | 3/2008 | Linse | G01V 3/101 |
| | | | 324/326 |
| 2010/0201380 A1 * | 8/2010 | Del Monte | G01V 3/10 |
| | | | 324/655 |
| 2013/0063160 A1 * | 3/2013 | Nakano | G01R 31/06 |
| | | | 324/653 |
| 2014/0376586 A1 | 12/2014 | Dawson et al. | |
| 2017/0176623 A1 | 6/2017 | Appleby et al. | |

FOREIGN PATENT DOCUMENTS

| | | |
|---|---|---|
| EP | 1 580 889 A1 | 9/2005 |
| EP | 1 965 177 A1 | 9/2008 |
| EP | 2 017 652 A1 | 1/2009 |
| EP | 2 493 076 A1 | 8/2012 |
| EP | 2 546 614 A1 | 1/2013 |
| EP | 2 748 936 B1 | 2/2016 |
| FR | 2 827 677 A1 | 1/2003 |
| WO | 2013/026986 A1 | 2/2013 |
| WO | 2015/143500 A1 | 10/2015 |

* cited by examiner

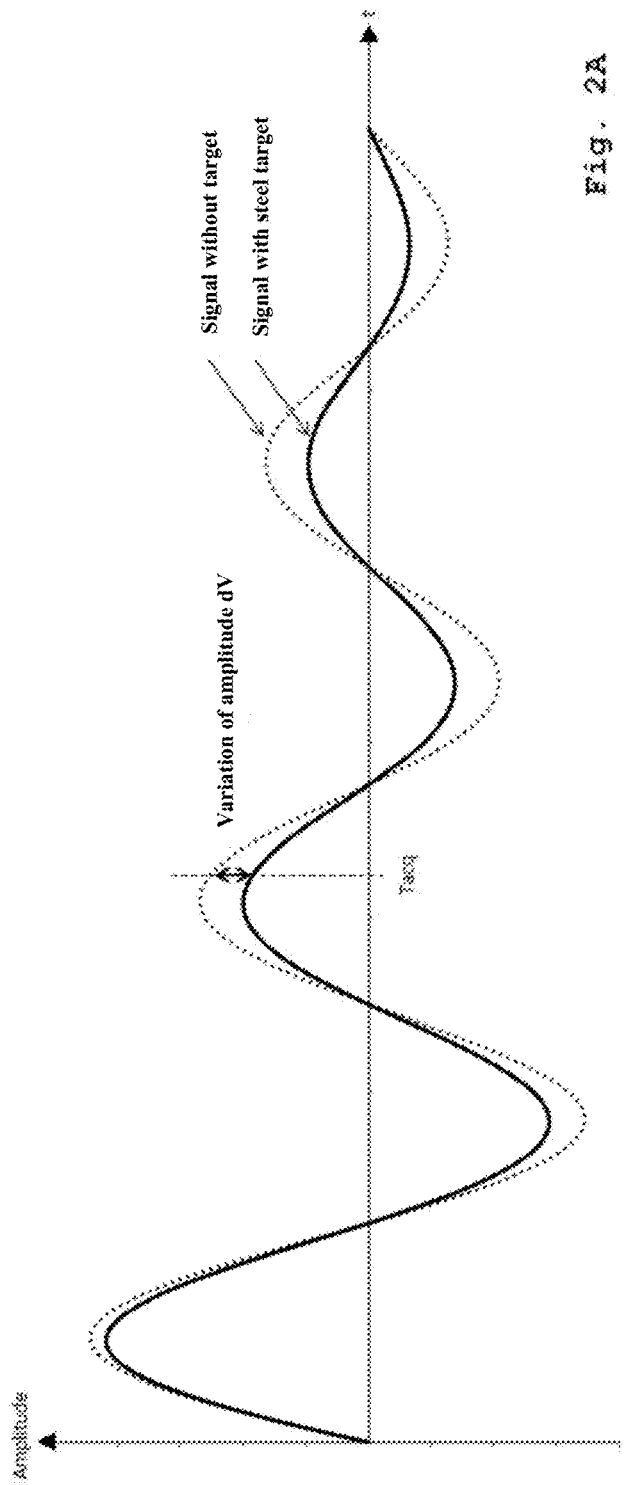

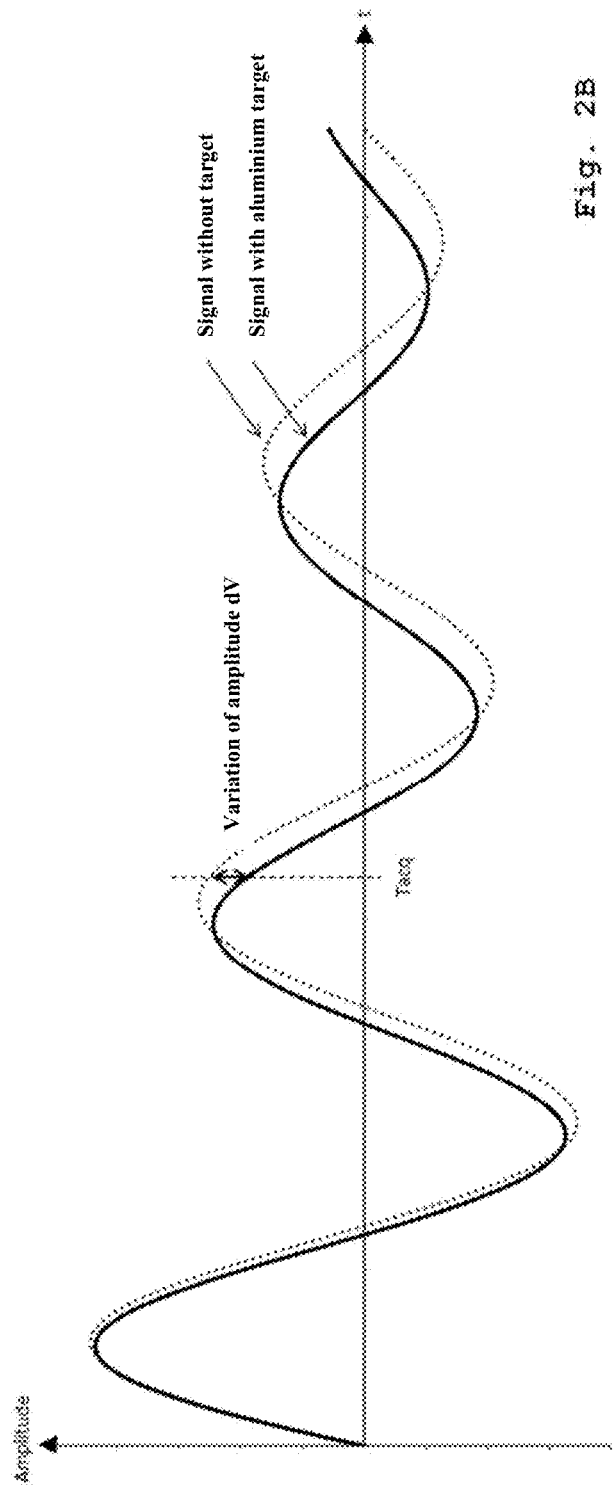

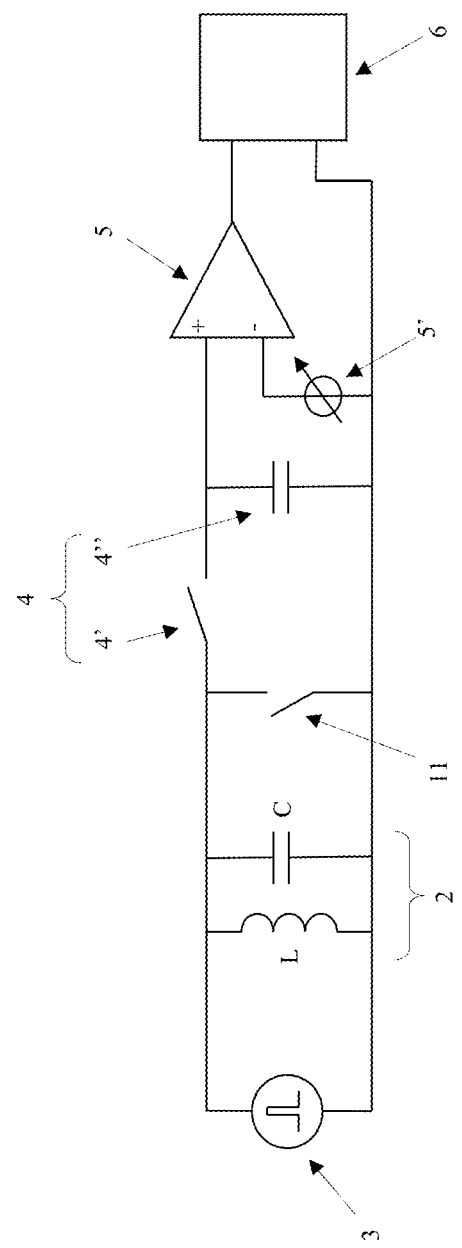

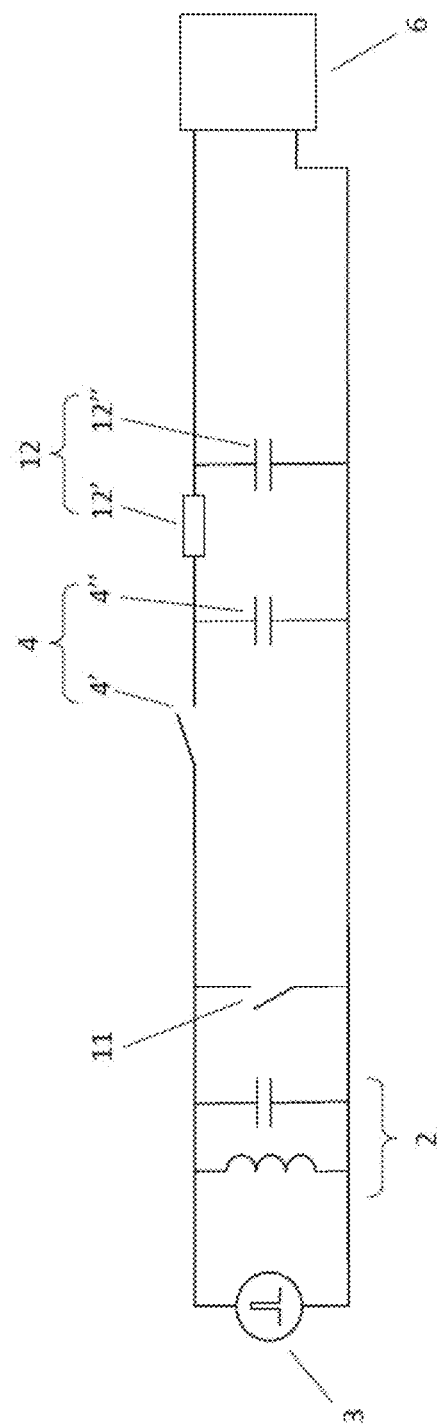

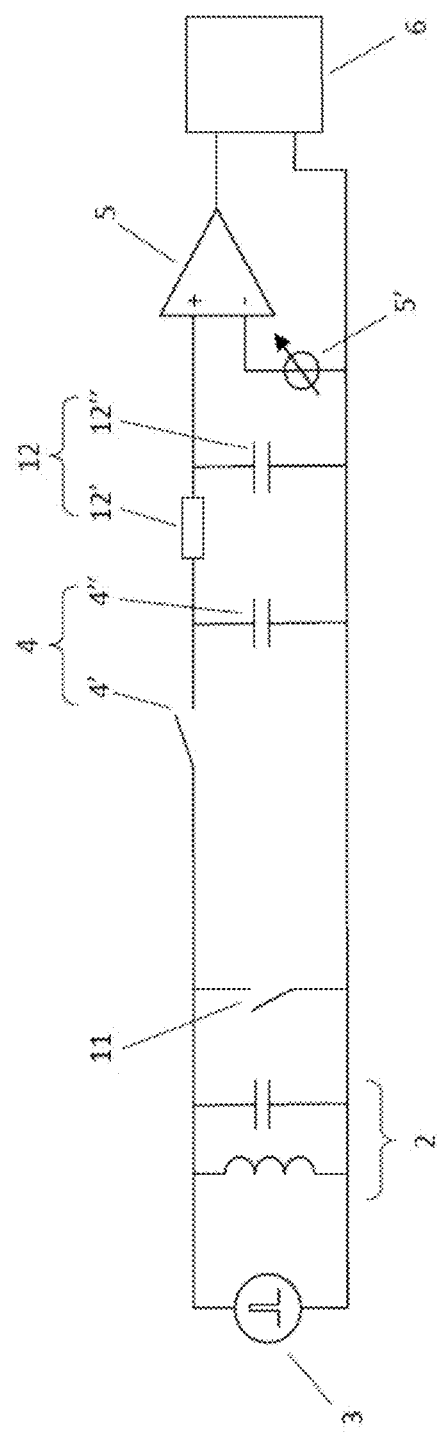

FACTOR 1 INDUCTIVE SENSOR DEVICE

The present invention relates to the field of inductive sensor devices, which make it possible to detect the presence in a given place or position or the proximity of a metal object, in particular sensors used in industry and based on the analysis of the signal provided by at least one LC resonant circuit.

Such sensors have been commercialised by the Applicant for many years and are described for example in the documents FR 2 827 677, EP 1 580 889, EP 1 580 536, EP 1 965 177 and EP 2 546 614.

More specifically the object of the invention is a proximity or presence sensor device, of the inductive type and "factor 1" type, that is it is designed and functions so as to provide preferably a very small variation in the detection distance for the various main metal materials (steel, aluminium, brass, copper, zinc, . . . ).

In the case of a conventional inductive sensor, the nominal detection distance Sn is always defined for a steel target (standard EN60947-5-2). For other metals, such as aluminium or copper, to determine the detection distance, it is necessary to apply a correction factor to said nominal Sn range. For example, the detection distance for aluminium can be 0.40×Sn (factor 0.40) or 0.70×Sn (factor 0.70) for stainless steel. For steel, the factor is 1, that is a detection distance of 1×Sn=Sn.

It should be noted that in terms of detection, metal materials can be classified into two categories:
 ferromagnetic materials (steel, iron) which when they are in the proximity of a detection coil have the tendency to increase the series resistance Rs of the coil (the Ls series inductance varying little);
 non-ferromagnetic materials (aluminium, copper, brass . . . ) which when they are in the proximity of a detection coil have the tendency to reduce the Ls series inductance of the coil (Rs varying little).

In the prior art, a sensor can be qualified "factor 1" as soon as it is designed and it functions such that essentially the same detection distance Sn applies to all metals, or at least to principles between them (that is at least: steel, iron, aluminium, copper, brass, zinc and possible alloys of the latter).

FIG. 1 illustrates schematically the main parameters involved in the definition of the performances/characteristics of this type of sensor. Said figure shows:
 the nominal range "Sn": conventional range used to identify the sensor;
 the real range "Sr": ranged measured under nominal supply voltage and at ambient temperature (+/−10% Sn);
 the useful range "Su": range measured within the admissible limits of temperature and supply voltage (+/−10% Sr).

There are already numerous embodiments of "factor 1" sensors, such as for example transmission/reception based systems (transformer type assembly) with 3 or 4 coils (cf. U.S. Pat. No. 7,106,052 and EP 2 493 076 A1) or systems based on the frequency measurement (cf. EP 2 017 652 A1).

However, said systems which use a plurality of coils are complex, expensive and bulky. Furthermore, a system based on frequency can make it necessary to use expensive components but also has limited performance (low switching frequency, low detection distance).

To overcome these disadvantages a proximity or presence sensor device has been proposed, of the inductive type and functioning in "factor 1" mode, i.e. has a very low variation in the detection distance Sn for the main types of metals and comprises essentially on the one hand an LC resonant circuit supplied by an excitation pulse generator defining successive and repetitive detection phases, on the other hand an operational chain of means for acquiring and processing the response signal, in the form of free oscillations, supplied by said LC sensor circuit during each detection phase, comprising in particular a sampling means and an analogue/digital conversion circuit and lastly a functional assembly of means for evaluating at least one time-delayed value of the processed signal and supplying information or a logical detection or non-detection signal.

Such a sensor device is known for example, at least partly, from document EP 1 530 064.

In the case of such a free oscillator assembly of the LC resonant type, there is:
 a variation in the amplitude of the oscillations when the coil is located in the proximity of a ferromagnetic material;
 a variation in the frequency of oscillation when the coil is located in the proximity of a non-ferromagnetic material.

To perform a "factor 1" detection, it is sufficient to refer to two types of materials:
 steel, representing ferromagnetic materials, causing a variation of Rs and thus a variation in the amplitude in the case of an LC free oscillator;
 aluminium, representing non-ferromagnetic materials, causing a variation of Ls and thus a variation in the frequency in the case of an LC free oscillator.

In the case of steel (iron), the approach to a target causes a reduction of pseudo-oscillations, but little variation in the frequency of the signal (FIG. 2A).

In the case of aluminium, the approach to a target causes an increase in the frequency of pseudo-oscillations, whereas the amplitude of the signal hardly varies (FIG. 2B).

Document EP 1 530 064 indicates that there is a sampling moment "Trif" at which the conditions for "factor 1" functioning are verified, that is where the reduction of the amplitude of the signal caused by the approach to a steel target is equal to the reduction of the amplitude caused by the 1e dephasing of the sinusoid caused by the approach to an aluminium target (cf. FIG. 3).

In this EP document, the "Trif" moment is determined by calculation, but without the manner of determining values making it possible to perform said calculation being indicated. Furthermore, neither the method of production, nor the method of controlling the detector are discussed in this document.

Furthermore, the construction of the circuit disclosed by document EP 1 530 064 uses the detection signal in raw form, in particular unfiltered, and there is a weak dynamism of the detection signal and simultaneously a high temperature deviation of the latter.

The aim of the present invention is to improve a sensor device functioning in "factor 1" mode of the type disclosed by the aforementioned document EP 1 530 064, by overcoming at least some of the limitations of the latter and providing a device with an increased detection range and ensuring a reliable and reproducible detection.

In this respect the object of the invention is a proximity or presence sensor device, of the inductive type and "factor 1" type as discussed above, characterised in that the acquisition and processing means comprise, on the one hand, analogue means for the filtration and/or amplification of the sampled response signal, after its acquisition and before its digital conversion, and, on the other hand, a means for compensating the deviation in temperature of the response signal by correcting the sampled signal after its digital conversion, associated with or comprising a temperature sensor providing information about the temperature of at least one part of the sensor device, comprising the LC resonant circuit and means for the acquisition and processing of the operational chain located upstream of the A/D conversion circuit.

The invention is explained in more detail in the following description which relates to a preferred embodiment, given by way of a non-restrictive example, and explained with reference to the accompanying schematic drawings, in which:

FIGS. 5A to 5F are simplified equivalent electric diagrams of different embodiments of the operation production and acquisition chain of the sensor signal forming part of the device according to the invention;

Figure 6:
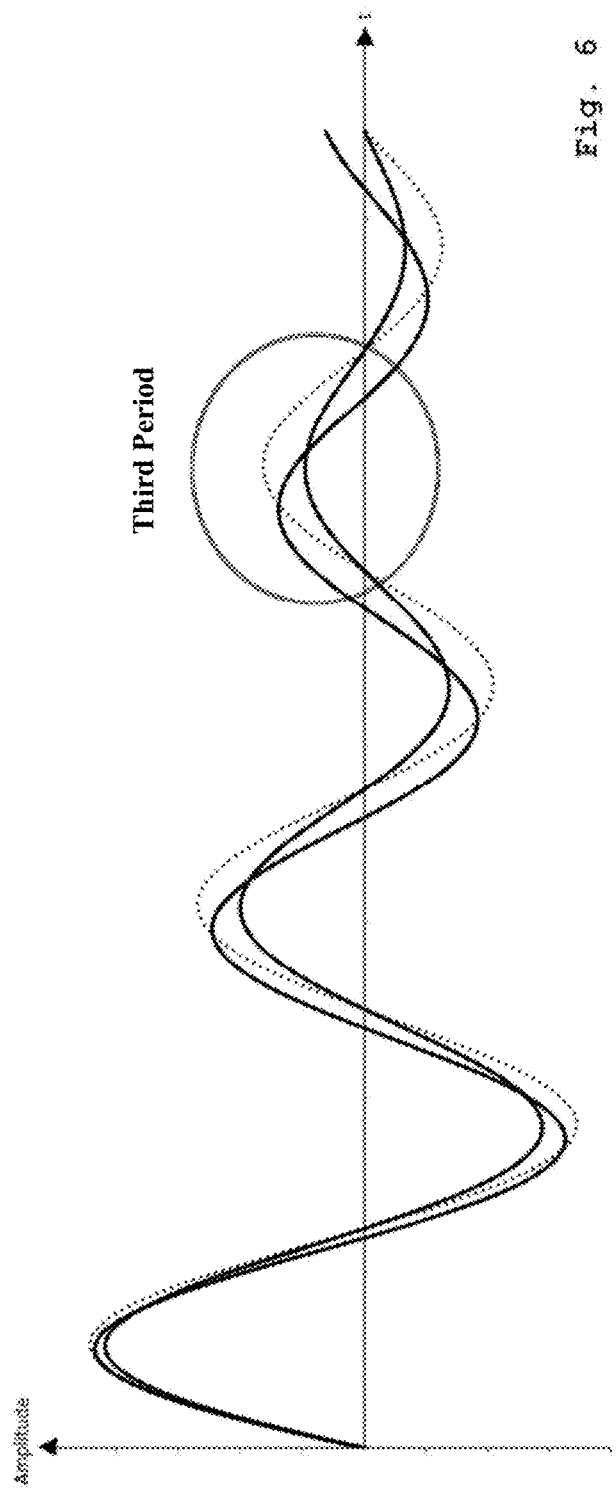
Figure 7:
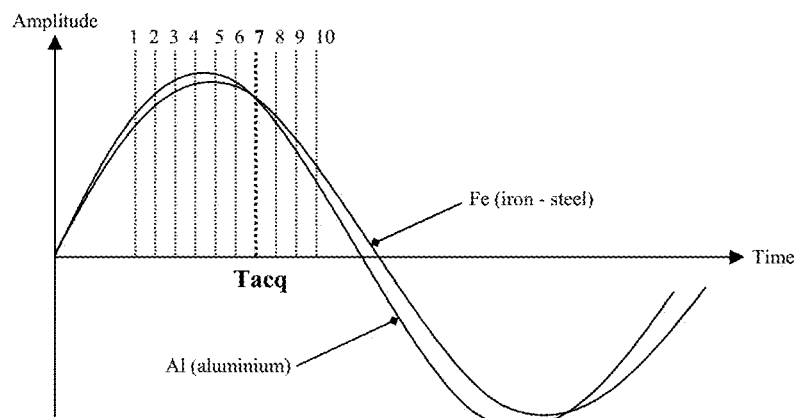
Figure 8A:
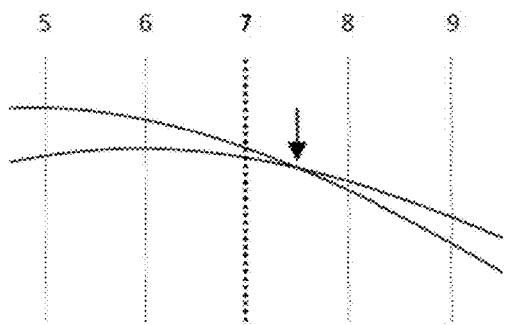
Figure 8B:
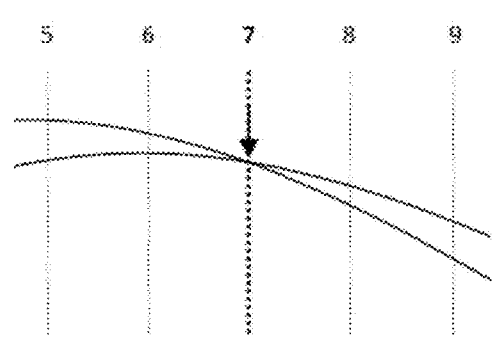
Figure 8C:
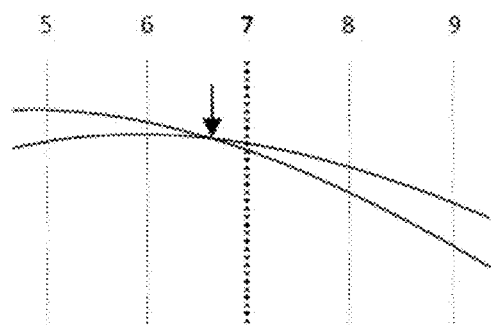
Figure 9:
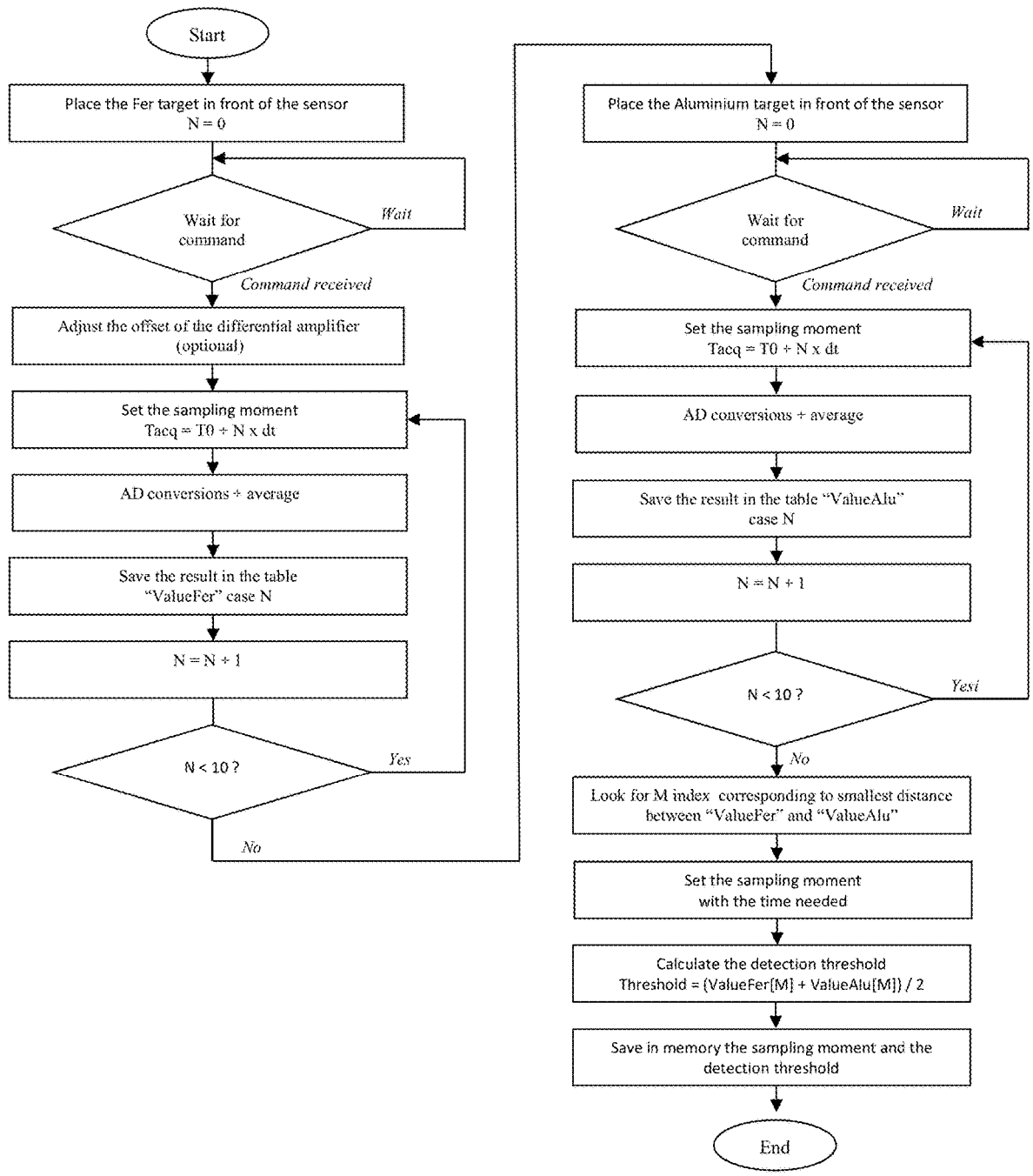

FIG. 6 is a graphic representation (with time delay) of the curves [amplitude/time] representing the sensor signals (pseudo-smoothed sinusoids) at the terminals of the LC resonant circuit of the sensor device according to the invention, in response to an impulse excitation in the absence of a target, in the presence of a steel target (iron-Fe) at distance Sn and in the presence of an aluminium (Al) target at distance Sn;

FIG. 7 is a representation on a different scale to detail A of FIG. 6, also showing the sampling moments of the signals (only the curves of the "iron" and "aluminium" signals are shown);

FIGS. 8A to 8C illustrate different cases of positioning the sampling moment "factor 1" (Tacq) relative to prospective sampling moments implemented effectively during the testing phase of the control and calibration of the sensor device according to the invention, and, FIG. 9 is a flowchart of the learning or calibration process implemented by the invention.

Figure 1:
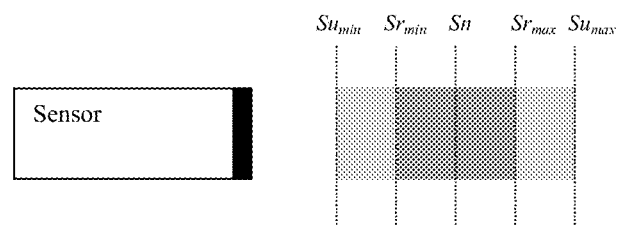
Figure 3:
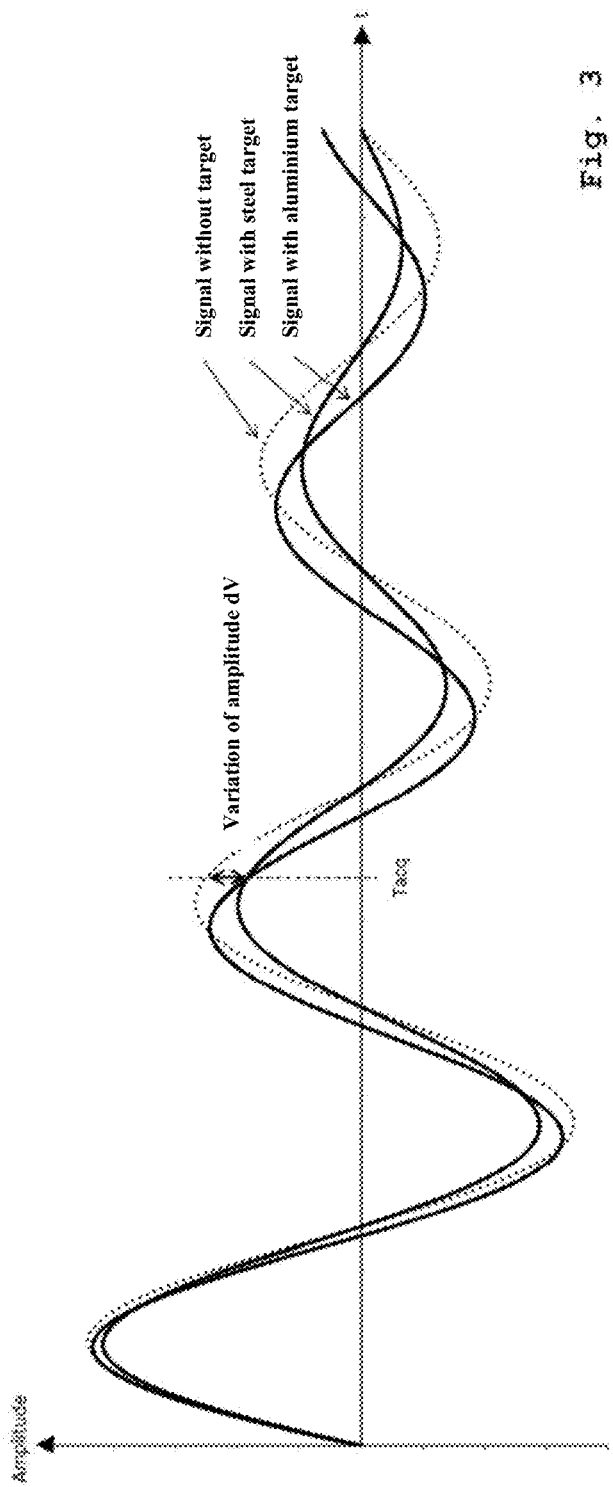
Figure 4:
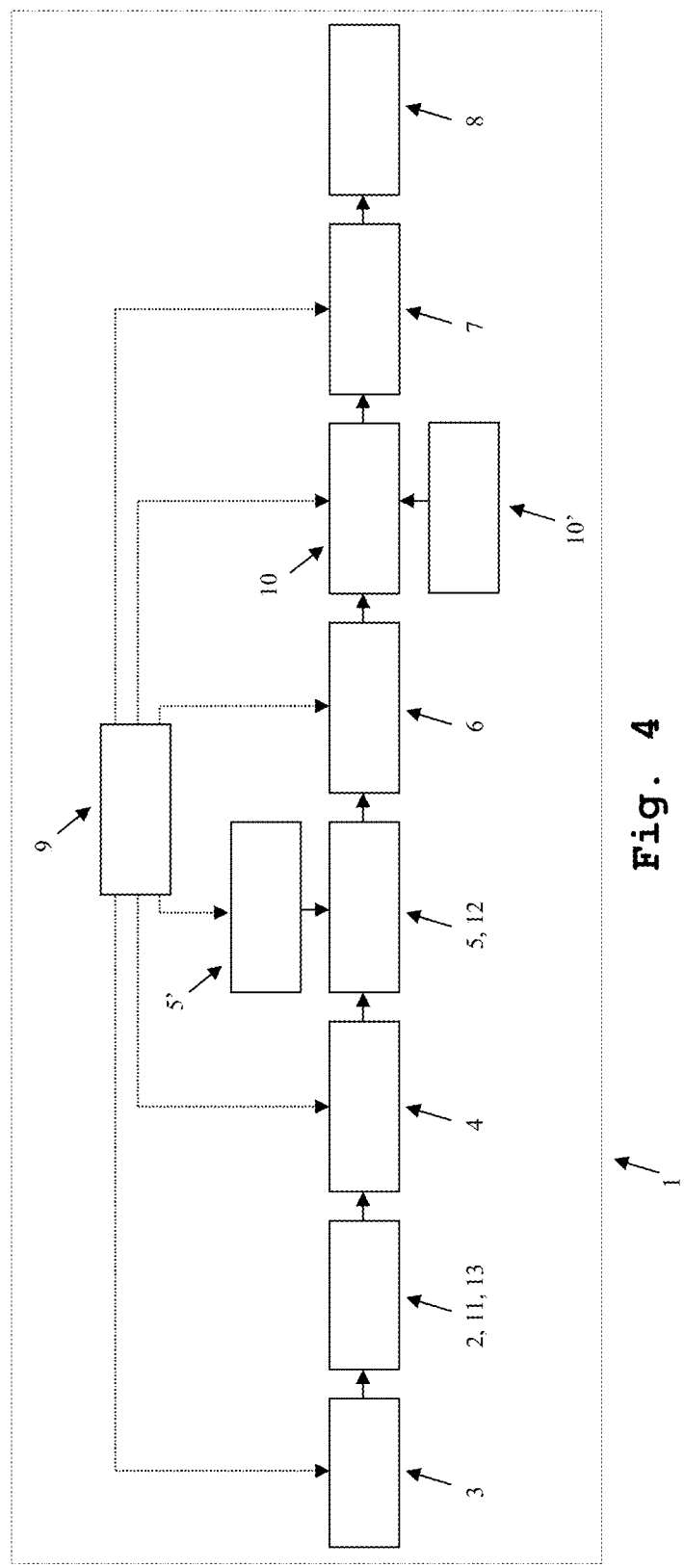
FIG. 4 is an overview of the main constituent functional elements of the sensor device according to the invention.

FIG. 4 and partially FIG. 5 illustrate synoptically and functionally, a proximity or presence sensor device 1, of the inductive type and functioning in "factor 1" mode.

Said device 1 comprises essentially, on the one hand, an LC resonant circuit 2 fed or charged by an excitation pulse generator 3 defining successive and repetitive detection phases and, on the other hand, an operational chain of means 4, 5, 6, 12 for the acquisition and processing of the response signal (free oscillations), supplied by said LC detection circuit 2 during each detection phase, comprising in particular a sampling means 4 and an analogue/digital conversion circuit 6, and lastly a functional assembly of evaluation means 7, 8 for evaluating, particularly by comparison, at least one time-locked value of the processed signal and for providing information or a logical detection or non-detection signal.

Said device 1 also comprises a management and control unit 9, of the microcontroller type, for controlling the functioning of said device 1.

According to the invention, the aforementioned acquisition and processing means comprise, on the one hand, analogue means 5; 12,13 for the filtration and/or amplification of the sampled response signal, after its acquisition and before its digital conversion, and, on the other hand, a means 10 for compensating for the deviation in temperature of the response signal by correcting the sampled signal after its digital conversion, associated with or comprising a temperature sensor 10' providing information about the temperature of at least one part of the sensor device 1, comprising the LC resonant circuit 2 and means 4, 5, 11, 12, 13 for the acquisition and processing of the operational chain located upstream of the A/D conversion circuit 6.

By means of said particular arrangements which contribute cumulatively to the improvement of performance in terms of quality and precision and therefore of the maximum range of the sensor device 1, the dynamic of the usable signal and its independence relative to variations in temperature are considerably improved relative to the prior art.

Advantageously, the evaluation of the sampled value at the critical moment determined is performed by comparison with a threshold value determined during the calibration phase during production.

Preferably, and as shown in FIGS. 5A, 5C, 5E and 5F, the operational chain comprises, following the sampling means 4, for example in the form of a sampler blocker, an amplification means in the form of a differential amplifier, associated with a means 5' for subtracting the continuous component of the signal presented at the input of the differential amplifier 5.

Furthermore, it is possible to provide structural devices for increasing the dynamic of the signal:

using a blocker sampler 4 external to the microcontroller 9, making it possible to reduce the sampling time, to better target the point to the sampled and to perform analogue processing (amplification, filtration) before the analogue-digital conversion;

increasing the resolution of the A/D converter 6 (for example to 12 bits), said circuit performing an analogue-digital conversion of the signal from the amplifier 5 and not a direct conversion of the output signal of the LC circuit 2.

In order to avoid parasite signals or high frequency interference, it is possible, as shown in FIGS. 5B to 5D and 5F, that the operational chain comprises, following a sampling means 4 and upstream of the conversion circuit 6 as well as potentially before the possible amplification means 5, an analogue filtration circuit 12, preferably in the form of an RC low-pass filter comprising a series resistor 12' and a parallel capacitor 12".

To facilitate and increase the frequency and the repeatability of detection cycles or phases, it is possible to provide, as shown symbolically in FIG. 5, downstream of the detection sensor 2 LC and upstream of the sampling means 4, a switching means 11 for selectively discharging said LC circuit 2.

The blocking sampler 4 can for example comprise a switch 4' associated with a memory capacity 4" (cf. FIG. 5).

Figure 5D:
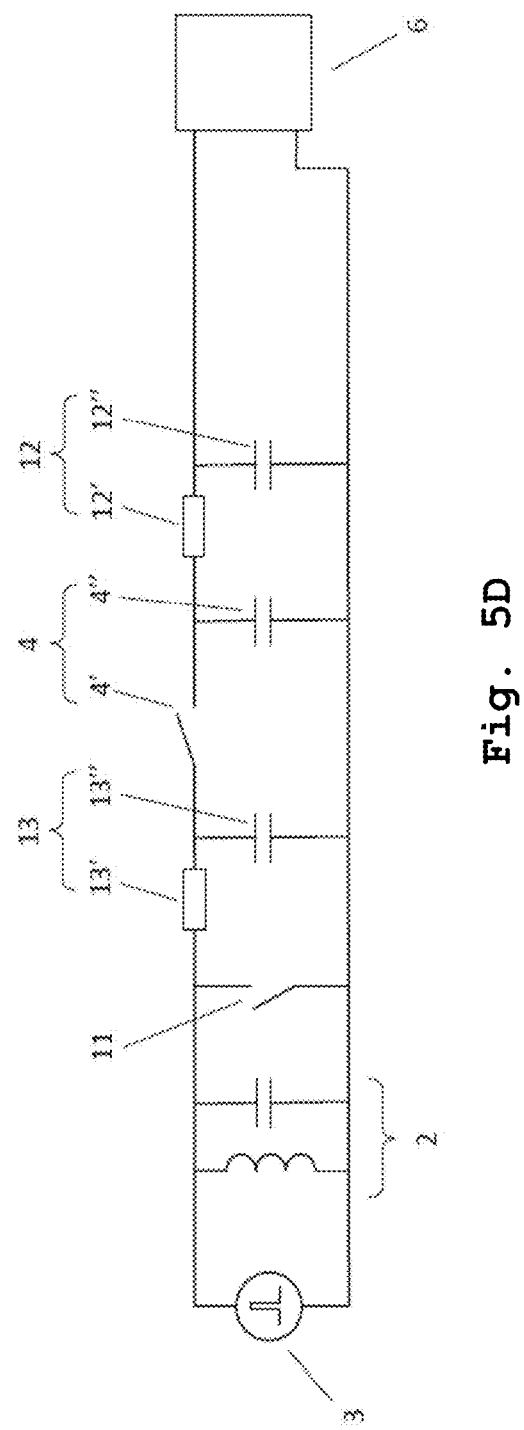
Figure 5E:
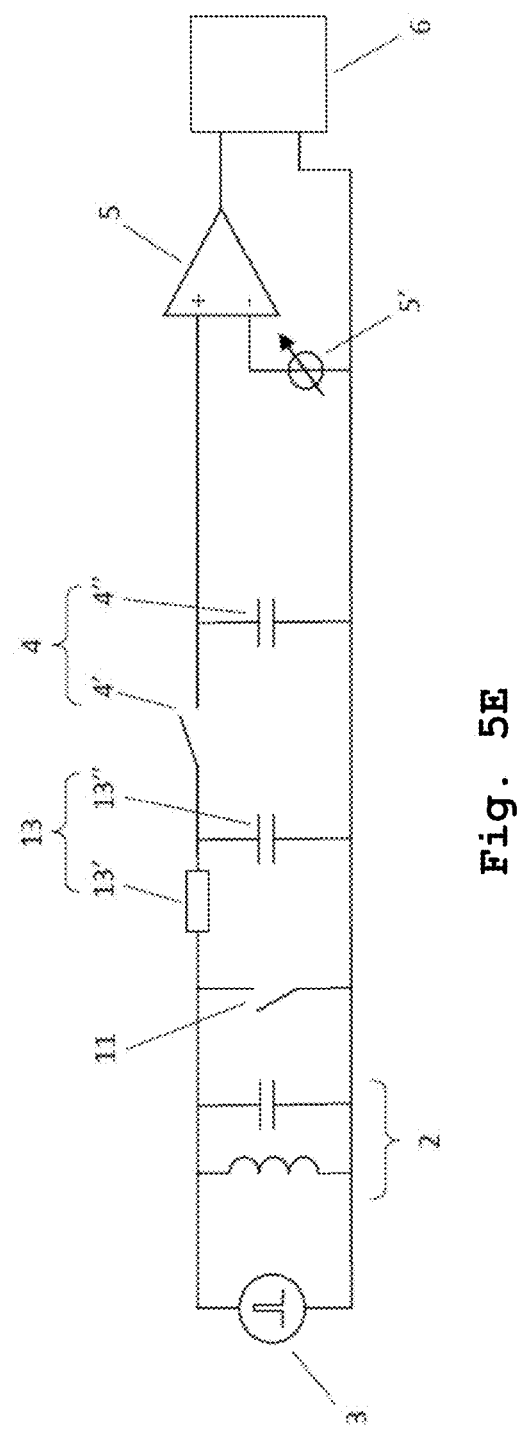
Figure 5F:
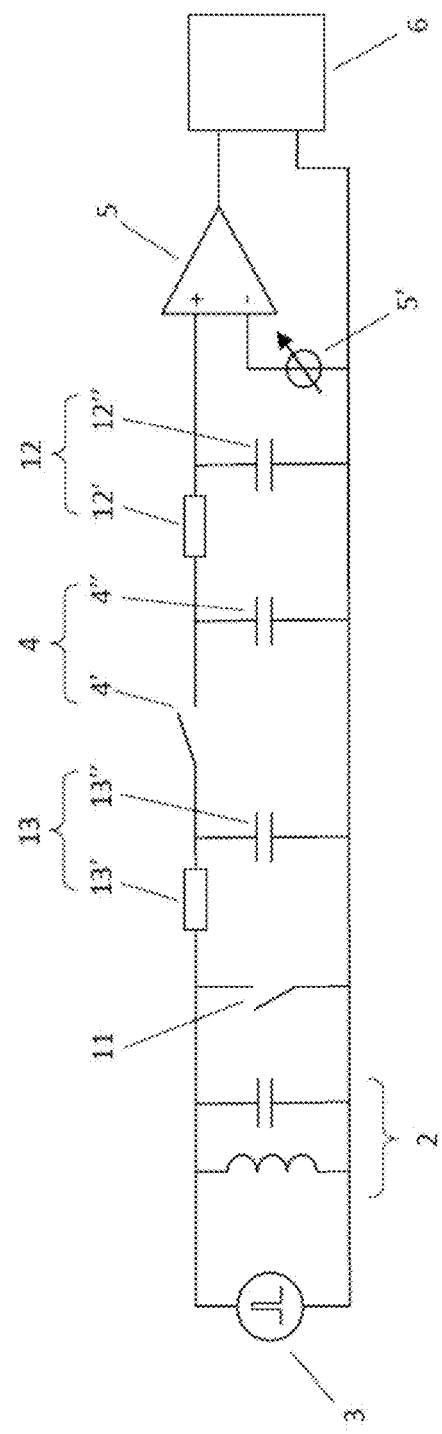

In an alternative or additional manner to the first aforementioned filtration circuit 12, possibly in association with the presence of an amplification means 5, the operational chain can also comprise, downstream of the LC detection circuit 2 and upstream of the sampling means 4, an analogue filtration circuit 13, preferably in the form of an RC low-pass filter comprising a series resistor 13' and a parallel capacitor 13" (FIGS. 5D to 5F).

FIGS. 5A to 5F illustrate different possible structural variants for the operational chain of the device 1 according to the invention as a function of combinations and the presence or non-presence of different filtration and amplification means 5, 12 and 13.

With regard to a practical implementation of the invention, the following considerations may be taken into account advantageously.

The filter 12, located possibly after the sampler 4, makes it possible to stabilise the signal before the analogue-digital conversion (suppression of interference induced by the sampler, suppression of crosstalk induced by the oscillating LC circuit, suppression of radiofrequency interference, . . . ). Its cut-off frequency is low (for example in the order of 16 kHz, but it can vary as a function of the features of the sensor device 1, in particular its switching frequency). In the case of the assembly of FIG. 5D, the capacitance 12″ has to be sufficiently high (for example 10 nF minimum) in order to limit the weakening induced by the charge transfer of this capacitance 12″ towards the internal capacitance of the analogue-digital converter 6 during the conversion.

The filter 13, located possibly in front of the sampler 4, mainly makes it possible to reduce the radiofrequency interference picked up by the inductance of the LC circuit (antenna effect). The cut-off frequency of this filter 13 has to be higher than the oscillation frequency of the LC circuit 2 so as not to alter the useful signal. The cut-off frequency typically extends from several hundreds of kHz to several tens or hundreds of MHz as a function of the actual type of radiofrequency interference. The capacity 13″ has to be low value (several tens or hundreds of pF) and the resistance 13′ can be replaced by a low inductance or a ferrite.

Thus the "low-pass" filtering performed by the filter 12 or filter 13, or even by the concurrent use of these two filters 12 and 13, makes it possible on the one hand to stabilise the signal (before and/or after sampling) and on the other hand to immunise the sensor device 1, and in particular the part of its operational chain located before the converter 6, against the high frequency electromagnetic interference, present in industrial environments (such as for example an assembly line, in particular by soldering).

Of course, the resistors 12′ and 13′ can be replaced by inductances.

With regard to the gain of the amplification means 5, the latter should be sufficiently high to essentially improve the dynamics of the useful signal. It should not be too raised either to avoid the saturation of the amplifier 5, particularly in case of a continuous deviation of the signal and its component during variations in temperature. A gain of 5 and 10, preferably fixed at about 6, has provided satisfactory results during trials conducted by the inventors.

According to an advantageous feature of the invention, the means 10 for compensating the deviation in temperature consists of a logical task executed by the microcontroller 9 at each detection phase, with the use on the one hand of the value measured by the temperature sensor 10′ and on the other hand stored information resulting in prior experimental evaluations relating to the influence of the temperature on the detection signal, said stored information consisting of an estimated compensation function or a correlation table for example.

Thus, in order to achieve a sufficiently precise and repeatable compensation for respecting normative constraints (cf. EN60947-5-2 allowing a deviation in temperature of the +/−10% from the actual range), the solution according to the invention for compensating the deviation in temperature is based on a digital correction of the signal from a raised temperature via a sensor 10′.

To achieve this compensation of temperature, it is necessary to previously take note of the deviation of the signal as a function of temperature. Said measures of the deviation are performed with the output values of the A/D converter 6 in order to compensate both the deviation of the inductance sensor (LC circuit 2) as well as the whole consecutive acquisition chain.

Having previously performed (in a clarification phase) digital readings of the deviation of the signal on a plurality of identical sensor devices 1, it is possible to determine an average and repeatable deviation for at least a series of such devices 1. It is possible to compensate the deviation by means of a directly coded function in the microcontroller 9. The compensation can also be performed by means of a correlation table (referred to as a "look up table").

According to another feature of the invention, which makes it possible to avoid any complex calculations as well as having to use resources to this effect, it is ensured advantageously that the value of the time setting (value of time delay after end of the pulse excitation), which is used by the microcontroller 9 for controlling the blocker sampler 4 and which corresponds to the "factor 1" point, consists of a couple [value of amplitude; time delay after end of excitation impulse] determined experimentally by sampling the response signals supplied by the respective iron and aluminium targets which are placed at the desired detection distance Sn, said response signals being read by the detection device 1 ready to be used.

In practice, and as shown in FIG. 6, the "factor 1" point selected corresponds preferably to the intersection of the two curves of the response signals of iron and aluminium targets, in the form of smoothed sinusoidal pseudo-oscillations, in the descending phase of the positive alternation of their third period. However, any other intersection point between the two curves can be used, including those during the negative alternations of the response signals.

Thus, according to one feature of the invention, there is in a control phase, for determining:

the optimal sampling point enabling a "factor 1" detection;

the switching point of the device 1 associated with the required range Sn.

In practice, the chosen solution is based on the search for the "factor 1" point by successive sampling. This method makes it possible to find the optimal point once the device 1 has been fully assembled and resinated, while eliminating the use of an external and expensive device (calculator, . . . ). This technique also makes it possible to better approach the nominal range Sn, which is of particular interest in the case of increased ranges and/or extended temperature ranges.

For each of the two reference materials (iron and aluminium) placed at the desired detection distance Sn, the microcontroller 9 conducts N measurements around the "factor 1" point with an sampling moment "Tacq" variant of T0 to T0+N.dt (Tacq=T0+N×dt with dt corresponding to the time resolution and N variant of 0 to 9 in this case). The amplitudes corresponding to different samples are saved in the tables ("ValueFe" and "ValueAl").

Although the "factor 1" point (intersection of the Fe/Al curves) exists over each of the periods of the smoothed oscillatory signal, the sampling at the start of the descending phase of the third period (cf. FIG. 6) appears to be a good compromise in terms of stability.

The number N of sampling points selected has to be fairly high (at least 10) in order to be able to find the "factor 1 point" in all cases: it is necessary to take into account the initial tolerances of the components which introduce variations of amplitude, frequency or reference time of one part from the other.

The results of sampling the two curves of FIG. 7 are presented in the following table in two parts:

|  | Sample (N) | | | | |
| --- | --- | --- | --- | --- | --- |
|  | 1 | 2 | 3 | 4 | 5 |
| Delay time Tacq | T0 | T0 + dt | T0 + 2dt | T0 + 3dt | T0 + 4dt |
| ValueFe (LSB) | 2050 | 2060 | 2066 | 2070 | 2071 |
| ValueAL (LSB) | 2058 | 2069 | 2075 | 2078 | 2077 |
| Distance Fe/Al (LSB) | 8 | 9 | 9 | 8 | 6 |
|  | Sample (N) | | | | |
|  | 6 | 7 | 8 | 9 | 10 |
| Delay time Tacq | T0 + 5dt | T0 + 6dt | T0 + 7dt | T0 + 8dt | T0 + 9dt |
| ValueFe (LSB) | 2069 | 2062 | 2052 | 2041 | 2027 |
| ValueAL (LSB) | 2072 | 2061 | 2049 | 2034 | 2015 |
| Distance Fe/Al (LSB) | 3 | 1 | 3 | 7 | 12 |

The values "ValueFe" and "ValueAl" are then compared with one another, which makes it possible to determine the absolute value of the distance between the value ValueFe[N] and ValueAl[N]. The lowest distance corresponds to the closest sampling point of the "factor 1" point which is the intersection point of the two response curves Fe and Al.

The index M corresponding to the lowest distance Fe/Al makes it possible to determine:
the sampling moment Tacq=T0+M×dt optimal for a "factor 1" detection;
the detection threshold selected corresponding to the average between ValueFe[M] and Value Al[M].

The sampling moment Tacq corresponds theoretically to the intersection between the response curves of Fe (iron) and Al (aluminium), but in practice a distance may be observed between the sampling point and the actual intersection of the two curves (cf. FIGS. 8A to 8C). In the development phase it is necessary to check that despite this distance, the sensor device 1 can always be considered to be "factor 1", that is the variation of the actual range Sr as a function of the materials attributable to this gap remains within +/−10% Sn allowed by standard EN60947-5-2.

In the production phase, the control of the sampling point Tacq and the control of the detection distance Sn is performed in two successive steps (the two steps can be switched over):

1. A steel (iron) target is placed in front of the sensor device 1 at distance Sn and a control starts a learning sequence making it possible to complete the "ValueFe" table. The sensor signals the end of this procedure by means of the output.

2. An aluminium target is placed in front of the sensor device 1 at distance Sn and a control starts a learning sequence making it possible to complete the "ValueAl" table.

Then, by means of the two tables the microcontroller 9 is able to determine the optimal sampling point and the detection threshold. These two parameters are then saved in the memory and recalled each time the sensor starts. The sensor device 1 signals the end of this procedure by means of its output.

The learning command can be sent via a settings interface which communicates via supply lines and the output of the sensor device, as disclosed in document EP 2 748 936 in the name of the Applicant.

Another important point for approaching the maximum of the "factor 1" point is to provide an increased time resolution for the sampling and therefore an increased and stable clock cycle for the microcontroller 9, preferably in the order of 32 MHz at least and with a small deviation in temperature. Thus time bases in the form of quartz resonators or MEMS oscillators are preferable.

The subject matter of the invention is also a method for calibrating a sensor device 1 as discussed above, characterised in that it consists of placing successively an iron target and an aluminium target at the desired detection distance Sn, acquiring a plurality of samples, preferably at least ten, of the sinusoidal response signal provided by the LC detection circuit 2 of the sensor device 1 after the pulse excitation of said circuit, preferably during the descending phase of the first alternation of the third period of said two signals, and determining by comparison, and possible interpolation, the coordinates (amplitude, time) of the intersection point of the representative curves of the two response signals corresponding to the "factor 1" point.

One possible practical embodiment of the different steps of the aforementioned method is illustrated in FIG. 9.

Of course, the invention is not limited to the described embodiment represented in the accompanying drawings. Modifications are still possible, in particular from the point of view of the composition of the various elements or substituting equivalent techniques, without departing as such from the field of protection of the invention.

The invention claimed is:

1. Proximity or presence sensor device, of the inductive type and functioning in "factor 1" mode with a variation in its detection distance Sn for the various metals, said sensor device comprising both an LC resonant circuit fed or charged by an excitation pulse generator defining successive and repetitive detection phases, as well as an operational chain of means for the acquisition and processing of the response signal in the form of free oscillations, supplied by said LC detection circuit during each detection phase, comprising in particular a sampling means and an analogue/digital conversion circuit, and lastly a functional assembly of evaluation means for evaluating at least one time-locked value of the processed signal and for providing information or a logical detection or non-detection signal, said device also comprising a management and control unit microcontroller as said evaluation means for controlling the functioning of said device, wherein the acquisition and processing means comprise both analogue means for the filtration and/or amplification of the sampled response signal, after its acquisition and before its digital conversion, as well as means for compensating for the deviation in temperature of the response signal by correcting the sampled signal after its digital conversion, associated with or comprising a temperature sensor which provides information about the temperature of at least one part of the sensor device, comprising the LC resonant circuit and means for the acquisition and processing of the operational chain located upstream of the A/D conversion circuit.

2. Sensor device according to claim 1, wherein the operational chain comprises, following the sampling means in the form of a sampler blocker, an amplification means in the form of a differential amplifier, associated with a means for subtracting the continuous component of the signal presented at the input of the differential amplifier.

3. Sensor device according to claim 1 wherein the operational chain comprises, following the sampling means and upstream of the conversion circuit, as well as potentially before an amplification means, an analogue filtration circuit.

4. Sensor device according to claim 1, further comprising, downstream of the LC detection circuit and upstream of the sampling means, a switching means for selectively discharging said LC circuit.

5. Sensor device according to claim 1, wherein the operational chain comprises, upstream of the LC detection circuit and upstream of the sampling means, an analogue filtration circuit.

6. Sensor device according to claim 1, wherein the means for compensating the deviation in temperature consists of a logical task executed by the microcontroller, at each detection phase, with the use both of the value measured by the temperature sensor, as well as stored information resulting in prior experimental evaluations relating to the influence of the temperature on the detection signal, said stored information consisting of an estimated compensation function or a correlation table for example.

7. Sensor device according to claim 1, wherein the value of the time setting which is used by the microcontroller for controlling the sampling means and which corresponds to the "factor 1" point, consists of a couple [value of amplitude; time delay after end of excitation pulse] determined experimentally by sampling the response signals supplied by respective iron and aluminium targets placed at the desired detection distance, said response signals being read by the sensor device ready to be used.

8. Sensor device according to claim 7, wherein the "factor 1" point selected corresponds to the intersection of the two curves of the response signals of the iron and aluminium targets, in the form of sinusoidal smoothed pseudo-oscillations, in the descending phase of the positive alternation of their third period.

9. Method for calibrating a sensor device according to claim 1, further comprising placing successively an iron target and an aluminium target at the desired detection distance, acquiring a plurality of samples of the sinusoidal response signal supplied by the LC detection circuit of the sensor device after the pulse excitation of said circuit, advantageously during the descending phase of the first alternation of the third period of said two signals, and determining by comparison, and possible interpolation, the coordinates (amplitude, time) of the intersection point of the representative curves of the two response signals corresponding to the "factor 1" point.

10. The sensor device of claim 1, wherein the means for evaluating operates by comparison.

11. The sensor of claim 3, wherein the analog filtration circuit comprises an RC low-pass filter comprising a series resistor and a parallel capacitor.

12. The sensor of claim 5, wherein the analog filtration circuit comprises an RC low-pass filter comprising a series resistor and a parallel capacitor.

13. The method of claim 9, wherein there are at least ten of the samples of the sinusoidal response signal.

14. Sensor device according to claim 2, wherein the operational chain comprises, following the sampling means and upstream of the conversion circuit, as well as potentially before the possible amplification means, an analogue filtration circuit.

15. Sensor device according to claim 2, further comprising, downstream of the LC detection circuit and upstream of the sampling means, a switching means for selectively discharging said LC circuit.

16. Sensor device according to claim 3, further comprising, downstream of the LC detection circuit and upstream of the sampling means, a switching means for selectively discharging said LC circuit.

17. Sensor device according to claim 2, wherein the operational chain comprises, upstream of the LC detection circuit and upstream of the sampling means, an analogue filtration circuit.

18. Sensor device according to claim 3, wherein the operational chain comprises, upstream of the LC detection circuit and upstream of the sampling means, an analogue filtration circuit.

19. Sensor device according to claim 4, wherein the operational chain comprises, upstream of the LC detection circuit and upstream of the sampling means, an analogue filtration circuit.

20. Sensor device according to claim 2, wherein the means for compensating the deviation in temperature consists of a logical task executed by the microcontroller, at each detection phase, with the use both of the value measured by the temperature sensor, as well as stored information resulting in prior experimental evaluations relating to the influence of the temperature on the detection signal, said stored information consisting of an estimated compensation function or a correlation table for example.

\* \* \* \* \*